United States Patent
Dussaigne et al.

(10) Patent No.: US 9,331,233 B2
(45) Date of Patent: May 3, 2016

(54) METHOD FOR MANUFACTURING A SEMICONDUCTOR MICRO- OR NANO-WIRE, SEMICONDUCTOR STRUCTURE COMPRISING SUCH A MICRO- OR NANO-WIRE, AND METHOD FOR MANUFACTURING A SEMICONDUCTOR STRUCTURE

(71) Applicant: COMMISSARIAT A L'ENERGIE ATOMIQUE ET AUX ENE ALT, Paris (FR)

(72) Inventors: Amelie Dussaigne, Bizonnes (FR); Philippe Gilet, Teche (FR); Francois Martin, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/362,479

(22) PCT Filed: Dec. 19, 2012

(86) PCT No.: PCT/EP2012/076091
§ 371 (c)(1),
(2) Date: Jun. 3, 2014

(87) PCT Pub. No.: WO2013/092665
PCT Pub. Date: Jun. 27, 2013

(65) Prior Publication Data
US 2014/0327037 A1    Nov. 6, 2014

Related U.S. Application Data

(60) Provisional application No. 61/584,401, filed on Jan. 9, 2012.

(30) Foreign Application Priority Data

Dec. 20, 2011    (FR) .................................... 11 62029

(51) Int. Cl.
*H01L 33/20*    (2010.01)
*H01L 33/00*    (2010.01)
(Continued)

(52) U.S. Cl.
CPC ........ *H01L 33/0075* (2013.01); *H01L 21/0237* (2013.01); *H01L 21/0254* (2013.01);
(Continued)

(58) Field of Classification Search
CPC ......... H01L 33/00; H01L 33/20; H01L 33/12; H01L 33/32; H01L 31/0304; H01L 31/18; H01L 31/0352
USPC .............................. 257/103, 431, 13, 98, 99
See application file for complete search history.

(56) References Cited

U.S. PATENT DOCUMENTS

2005/0223969 A1*  10/2005  Chen et al. ..................... 117/105
2005/0224824 A1    10/2005  Kim et al.
(Continued)

FOREIGN PATENT DOCUMENTS

DE    10 2007 022 921 A1    1/2008
EP    1 727 216 A2    11/2006
EP    1 727 216 A3    11/2006

OTHER PUBLICATIONS

International Search Report issued Mar. 6, 2013, in PCT/EP12/076091 filed Dec. 19, 2012.
(Continued)

*Primary Examiner* — Chuong A Luu
*Assistant Examiner* — Rodolfo Fortich
(74) *Attorney, Agent, or Firm* — Oblon, McClelland, Maier & Neustadt, L.L.P.

(57) ABSTRACT

A method of manufacturing at least one semiconducting micro- or nano-wire used for formation of an optoelectric structure, optoelectronic structures including the micro- or nano-wires, and a method enabling manufacture of the photoelectronic structures. The method includes providing a semiconducting substrate, forming a crystalline buffer layer on the substrate, the buffer layer having a first zone over at least part of its thickness composed mainly of magnesium nitride in a form $Mg_xN_y$, and forming at least one semiconducting micro- or nano-wire on the buffer layer.

12 Claims, 6 Drawing Sheets

(51) Int. Cl.
*H01L 33/12* (2010.01)
*H01L 33/18* (2010.01)
*H01L 21/02* (2006.01)
*H01L 31/0352* (2006.01)
*H01L 31/0735* (2012.01)
*H01L 31/18* (2006.01)
*H01L 31/0304* (2006.01)
*H01L 33/32* (2010.01)
*H01L 33/08* (2010.01)
*H01L 33/40* (2010.01)

(52) U.S. Cl.
CPC .... *H01L21/02439* (2013.01); *H01L 21/02491* (2013.01); *H01L 21/02546* (2013.01); *H01L 21/02603* (2013.01); *H01L 21/02642* (2013.01); *H01L 31/03044* (2013.01); *H01L 31/0352* (2013.01); *H01L 31/03529* (2013.01); *H01L 31/035227* (2013.01); *H01L 31/0735* (2013.01); *H01L 31/1848* (2013.01); *H01L 31/1856* (2013.01); *H01L 33/007* (2013.01); *H01L 33/12* (2013.01); *H01L 33/18* (2013.01); *H01L 33/20* (2013.01); *H01L 33/32* (2013.01); *H01L 33/08* (2013.01); *H01L 33/40* (2013.01); *H01L 2924/0002* (2013.01); *Y02E 10/544* (2013.01); *Y02P 70/521* (2015.11)

(56) References Cited

U.S. PATENT DOCUMENTS

| | | |
|---|---|---|
| 2007/0041214 A1 | 2/2007 | Ha et al. |
| 2008/0023709 A1 | 1/2008 | Tsai et al. |
| 2008/0023835 A1 | 1/2008 | Tsai et al. |
| 2008/0036038 A1 | 2/2008 | Hersee et al. |
| 2009/0029497 A1 | 1/2009 | Tsai et al. |
| 2009/0169828 A1 | 7/2009 | Hersee et al. |
| 2009/0200667 A1 | 8/2009 | Tsai et al. |
| 2010/0142580 A1 | 6/2010 | Gilet et al. |
| 2011/0272723 A1 | 11/2011 | Ha et al. |
| 2012/0001153 A1 | 1/2012 | Hersee et al. |

OTHER PUBLICATIONS

French Preliminary Search Report issued Sep. 4, 2012, in French Application No. 1162029 filed Dec. 20, 2011.

Tun, et al., "Dislocation reduction in GaN with multiple $Mg_xN_y$/GaN buffer layers by metal organic chemical vapor deposition", Applied Physics Letters, vol. 90, No. 21, XP012094948, May 22, 2007, 3 pages.

Fu, et al., "Nitride-based blue light-emitting diodes with multiple $Mg_xN_y$/GaN buffer layers", Solid-State Electronics, Elsevier Science, vol. 54, No. 5, XP026965986, May 1, 2010, pp. 590-594.

\* cited by examiner

METHOD FOR MANUFACTURING A SEMICONDUCTOR MICRO- OR NANO-WIRE, SEMICONDUCTOR STRUCTURE COMPRISING SUCH A MICRO- OR NANO-WIRE, AND METHOD FOR MANUFACTURING A SEMICONDUCTOR STRUCTURE

TECHNICAL DOMAIN

The invention relates to the domain of detection, measurement and emission of electromagnetic radiation and devices used for detection, measurement and emission of electromagnetic radiation.

The past decade has been marked by strong development of optoelectronics and devices derived from optoelectronics. Such devices use semiconducting structures suitable for detection, measurement or emission of electromagnetic radiation.

These structures include semiconducting structures based on micro- or nano-wires with potentially high efficiencies for electromagnetic radiation reception, in the case of detection and measurement, or for electromagnetic radiation emission. These efficiencies are also sufficiently high so that the use of such structures can be envisaged for photovoltaic applications.

Such structures, regardless of whether they are used for detection, measurement or emission of electromagnetic radiation or photovoltaic applications, may more generally be called optoelectric structures.

Therefore, in the above and in the remainder of this document, the term optoelectric structure refers to any type of semiconducting structure suitable for converting an electrical signal into electromagnetic radiation or vice versa.

The invention is more particularly applicable to a method of manufacturing at least one semiconducting micro- or nano-wire, a semiconducting structure that will emit electromagnetic radiation, a semiconducting structure that can receive electromagnetic radiation and convert it into an electrical signal and a method of manufacturing an optoelectric structure.

STATE OF PRIOR ART

Semiconducting optoelectric structures based on micro- or nano-wires usually comprise a semiconducting support provided with semiconducting micro- or nano-wires and means of making electrical connections of said micro- or nano-wires. Each said micro- or nano-wire has an active zone, as a semiconducting junction, that can enable conversion of an electrical signal into an electromagnetic radiation or vice versa.

This active zone must be adapted either for absorption or emission of an electromagnetic radiation to enable either conversion of an electromagnetic radiation into an electrical signal or vice versa. In both of these cases, the adaptation requires in particular that each active zone of the micro- or nano-wires is at least partially made from one or several direct band gap semiconducting materials.

A direct band gap semiconducting material means a semiconducting material for which values of the wave vector k for the maximum energy of the valency band and the minimum energy of the conduction band in the energy dispersion diagram of said semiconducting material are approximately the same.

The direct band gap semiconducting materials most frequently used for optoelectric applications are semiconducting nitrides such as gallium nitride (GaN). For such an active zone, the part of each micro- or nano-wire in contact with the support is also made from a direct band gap semiconducting nitride, due to the technical limitations imposed by the method of manufacturing micro- or nano-wires.

Thus, methods of manufacturing an optoelectric structure based on micro- or nano-wires and for which the active zone is at least partially made from a direct band gap semiconducting nitride include a step to implement a method of forming a micro- or nano-wire on a substrate, in which the part of the micro- or nano-wires that is in contact with the substrate is made from a semiconducting nitride.

Such a method of forming micro- or nano-wires usually comprises steps to:
  provide a semiconducting substrate comprising a first and a second face;
  form a so-called buffer layer on the first face of the substrate, the layer being composed of aluminium nitride;
  form semiconducting micro- or nano-wires on the buffer layer, the so-called contact part of said micro- or nano-wire being composed mainly of a direct band gap semiconducting nitride, said part being the part of the micro- or nano-wire in contact with the buffer layer.

The formation step of the buffer layer is a step which, although it is accessory for some types of substrates in combination with an appropriate step for the formation of micro- or nano-wires, is nevertheless generally used to guarantee the crystalline quality of micro- or nano-wires.

The buffer layer can be used to make the crystal lattice accommodation between the substrate crystal lattice and the micro- or nano-wire crystal lattice, thus reducing constraints related to heteroepitaxy. For some types of epitaxy processes used during the micro- or nano-wire growth step, it can also protect the surface of the substrate against possible interaction between this surface and some of the elements forming the micro- or nano-wires, such as gallium (Ga) that could cause defects on the surface of the substrate.

One known method of providing the function to adapt the crystal lattice parameter and protect the substrate is to form the buffer layer from aluminium nitride (AlN).

Nevertheless, although such a buffer layer does enable the formation of high quality micro- or nano-wires without any risk of contaminating the substrate, it does have a number of disadvantages. Aluminium nitride is a very large band gap semiconductor, which therefore has low conductivity and therefore behaves like a semi-insulating material.

Therefore, this is why such a buffer layer cannot provide a low electrical resistance between the substrate and the micro- or nano-wires. The result is that optoelectric structures using such a buffer layer usually have relatively high working voltages.

Furthermore, a buffer layer of aluminium nitride posses a nucleation surface with an aluminium polarization. The growth of micro- or nano-wires of gallium nitride requires, ideally, a nucleation surface with an nitrogen polarization. Indeed, with an other polarity than nidrogen, such as aluminium polarization, the growth condition of the micro- or nano-wire has to be precisely determined to avoid the formation of an other type of structure such as a pyramidal structure. So the use of an aluminium nitride buffer layer requires an long and costly process of calibration of the manufacturing method of the micro- or nano-wire in such way the step of formation of the micro- or nano-wire don't give rise to the growth of a pyramidal structure instead of a micro- or nano-wire.

PRESENTATION OF THE INVENTION

This invention is designed to overcome these disadvantages.

Therefore one purpose of this invention is to disclose a method for manufacturing at least one micro- or nano-wire on a substrate, the method being capable of providing at least one micro- or nano-wire with good crystalline quality and lower electrical resistance between the substrate and the nano-wire than the resistance of micro- or nano-wires obtained using a method according to prior art, regardless of the epitaxial growth method used for the micro- or nano-wire formation step.

Another purpose of this invention is to furnish a method for manufacturing at least a nitride semiconducting micro- of nano-wire which comprises a step of forming a micro- of nano-wire which is realizes on an nidrogen polarized nucleation surface, with an electrical resistance between the substrate ands the micro- or nano-wire that is reduce relatively to the micro- or nano-wires obtained with a previous art's methods. To achieve this, the invention relates to a method of manufacturing at least one semiconducting micro- or nano-wire used for the formation of an optoelectric structure, said method comprising steps to:

provide a semi-conducting substrate comprising a first and a second face, form a crystalline layer called the buffer layer on the first face of the substrate, the buffer layer having a first zone in contact with the first face over at least part of its thickness, the first zone being composed mainly of magnesium nitride in the form $Mg_xN_y$;

form at least one semiconducting micro- or nano-wire on the buffer layer, at least one part of said micro- or nano-wire called the contact part being composed mainly of direct band gap semiconducting nitride, said part being the part of the micro- or nano-wire in contact with the buffer layer.

<<Composed mainly of magnesium nitride>> refers to a composition comprising a proportion of magnesium nitride greater than or equal to 95%, this proportion preferably being greater than 99%.

<<Composed mainly of a material>> also means that the composition comprises a proportion of said material greater than or equal to 95%, this proportion preferably being greater than 99%.

Due to the presence of a zone composed mainly of magnesium nitride in the form $Mg_xN_y$ and due to its crystalline quality, such a buffer layer enables the growth of at least one micro- or nano-wire composed mainly of semiconducting nitride with a good match of the crystal lattice parameter relative to a semiconducting substrate such as a silicon or a silicon carbide substrate, and therefore growth of at least one micro- or nano-wire with a low concentration of crystalline defects. Furthermore, compared with a buffer layer used in prior art, the interface resistance of such a layer is lower because its forbidden band is smaller than for the buffer layer in prior art. Thus, such a layer enables manufacturing of a structure for which the polarisation voltage of the micro- or nano-wire(s) is low, interface resistances between each micro- or nano-wire and the buffer layer being low.

Furthermore, when the micro- or nano-wire has a first type of conductivity in which the majority carriers are electrons, the relative proportion of nitrogen in the buffer layer can be controlled so that the buffer layer has the same type of conductivity as the micro or nano-wire.

Such buffer layer allows as well the furniture of a nucleation surface for the formation of a the micro- or nano-wire which has a nitrogen polarisation and which is in consequence especially adapted for the growth of semiconducting nitride micro- or nano-wires.

The contact part of the micro- or nano-wire could be constituted from gallium nitride.

Such method is especially suited to furnish a gallium nitride micro- or a nano-wire as the formation of the micro- or nano-wire is realized on a nucleation surface that presents a nitrogen polarization which is especially appropriates for the manufacturing of micro- or nano-wires, i.e wire type structures.

Indeed, a nucleation layer which presents such polarization will allow to obtain micro- or nano-structures with a wired shape and not with a pyramidal shape. Such a wire type structure, or micro- or nano-wire, show thus at least a vertical part which is along the m crystallographic plan. This vertical part which is along the m crystallographic plan can be place at the level of the part of the wire that is in contact with the nucleation layer. The part of the micro- or nano-wire in contact can present, on the surface which is in contact with the buffer layer, a nitrogen polarization.

In the buffer layer formation step, the buffer layer may be composed mainly of magnesium nitride in the form $Mg_xN_y$.

Thus, after the buffer layer formation step, the surface of the buffer layer opposite the first face of the substrate is suitable for the growth of micro or nano-wires without the need to form another zone of the buffer layer.

In the buffer layer formation step, the buffer layer has at least one second zone over its thickness, comprising the surface of the buffer zone that is opposite the first face of the substrate, said second zone being composed mainly of a direct band gap semiconducting nitride other than a magnesium nitride and preferably with a composition practically the same as the contact part of the micro- or nano-wire.

Such a second zone including the surface of the buffer zone can provide a growth surface with good crystal lattice compatibility with the material forming the contact part of the micro- or nano-wire, thus limiting the risks of creating crystalline defects in the micro or nano-wire during the formation step of the micro or nano-wire. This second zone also has the same kind of conductivity as the micro- or nano-wire with an almost identical concentration of majority carriers, thus limiting the interface resistance between said zone and the micro- or nano-wire.

The buffer layer formation step may be a step to form a layer with a thickness of between 1 and 100 nm, the thickness preferably being between 2 and 10 nm.

Such a thickness of the buffer layer can give good crystal lattice compatibility relative to the semiconducting substrate. This thickness also limits risks of contamination of the substrate for micro- or nano-wire manufacturing methods using a growth step such as Metalorganic vapour phase epitaxy (MOVPE).

In the buffer layer formation step, the first zone may be composed mainly of magnesium nitride in the form $Mg_3N_2$, preferably monocrystalline.

Such a composition made of magnesium and nitrogen can provide a high crystalline quality buffer layer for the growth of micro- or nano-wires. Furthermore, this quality of the buffer layer enables the supply of micro- or nano-wires with an appropriate type and concentration of majority carriers. Similarly, a monocrystalline buffer layer gives a growth of micro- or nano-wires along a given direction directly related to the crystalline planes of the buffer layer.

The formation step of the buffer layer may be a step forming a layer with a conductivity for which the majority carriers are electrons, the semiconducting nitride forming at least the contact part with the same type of conductivity as the buffer layer.

During the formation step of at least one micro- or nanowire, the semiconducting nitride forming at least the contact part may be chosen from the group comprising gallium nitride (GaN), aluminium nitride (AlN), indium nitride (InN), indium-gallium nitrides type $In_xGa_{1-x}N$, where x is between 0 and 1, and the aluminium-gallium-indium nitrides type $Al_xIn_yGa_{1-x-y}N$, where x+y is between 0 and 1.

These semiconducting nitrides can result in micro- or nano-wires appropriate for the detection, measurement or emission of electromagnetic radiation within ranges from the ultraviolet to the far infrared.

The formation step of at least one semiconducting micro- or nano-wire may comprise sub-steps to:
deposit a so-called masking layer on the buffer layer, the material forming the masking layer being adapted to enable selective growth of the semiconducting nitride on the buffer layer without any deposition on the masking layer during an adapted epitaxial deposition of the semiconducting nitride;
form at least one opening in the masking layer leading to the buffer layer,
form a micro or nano-wire in each opening by selective epitaxial deposition.

Such a step to form at least one micro- or nano-wire enables selective and perfectly controlled growth with the possibility of controlling the location of each micro or nano-wire relative to the substrate and to other structures formed in this substrate.

The invention also relates to a semiconducting structure designed to emit electromagnetic radiation, comprising:
a semiconducting substrate comprising a first and a second face;
a crystalline buffer layer in contact with the first face;
at least one semiconducting micro- or nano-wire in contact with the buffer layer, at least one so-called contact part of said micro- or nano-wire being made of a direct band gap semiconducting nitride, said contact part being part of the micro- or nano-wire in contact with the buffer layer, the micro or nano-wire also having an active zone adapted to emit electromagnetic radiation when it is polarised;
means of making the electrical connection of the micro- or nano-wire adapted to polarise the micro- or nano-wire and its active zone;
the buffer layer having a first zone in contact with the first face of the substrate over at least part of its thickness, the first zone being composed mainly of magnesium nitride in the form $Mg_xN_y$.

Thus, due to the good crystalline characteristic of each of the micro- or nano-wires, such a structure can have a good emission efficiency while having a lower operating voltage than a structure in prior art, because the electrical resistance between each micro- or nano-wire and the substrate is low.

The invention also relates to a semiconducting structure capable of receiving electromagnetic radiation and converting it into an electrical signal, said structure comprising:
a semiconducting substrate comprising a first and a second face;
a crystalline buffer layer in contact with the first face;
at least one semiconducting micro- or nano-wire in contact with the buffer layer, at least one part called the contact part of said micro- or nano-wire being made of a direct band gap semiconducting nitride, said contact part being the part of the micro- or nano-wire in contact with the buffer layer, the micro- or nano-wire also having an active zone adapted to receive electromagnetic radiation and convert it into an electrical signal;
electrical connection means adapted to enable electrical connection of the micro- or nano-wire so as to retrieve the electrical signal;
the buffer layer having a first zone in contact with the second face of the substrate over at least part of its thickness, the first zone being composed mainly of magnesium nitride in the form $Mg_xN_y$.

Thus, due to the good crystalline characteristic of each of the micro or nano-wires, such a structure may have good carrier photogeneration efficiency for detection and/or measurement of electromagnetic radiation with lower losses due to the electrical resistance between the substrate and each of the micro- or nano-wires than is possible with a structure according to prior art.

The invention also relates to a method of manufacturing an optoelectric structure according to the invention, said manufacturing method comprising steps to:
form at least one micro- or nano-wire according to a method of manufacturing micro- or nano-wires according to the invention;
form electrical connection means for the micro- or nano-wire.

Such a method can result in optoelectric structures that have good efficiency because each of the micro- or nano-wires has good crystalline quality, and also a relatively low working voltage, the interface resistance between the substrate and the micro- or nano-wires being lower due to the presence of the first zone composed mainly of magnesium nitride.

BRIEF DESCRIPTION OF DRAWINGS

This invention will be better understood after reading the following example embodiments given for information only and that are in no way restrictive, with reference to the appended drawings on which.

Identical, similar or equivalent parts of the various figures are marked with the same numeric references to facilitate a comparison between different figures.

The different parts shown in the figures are not necessarily drawn to the same scale, to make the figures more easily legible.

DETAILED PRESENTATION OF PARTICULAR EMBODIMENTS

Figure 1:
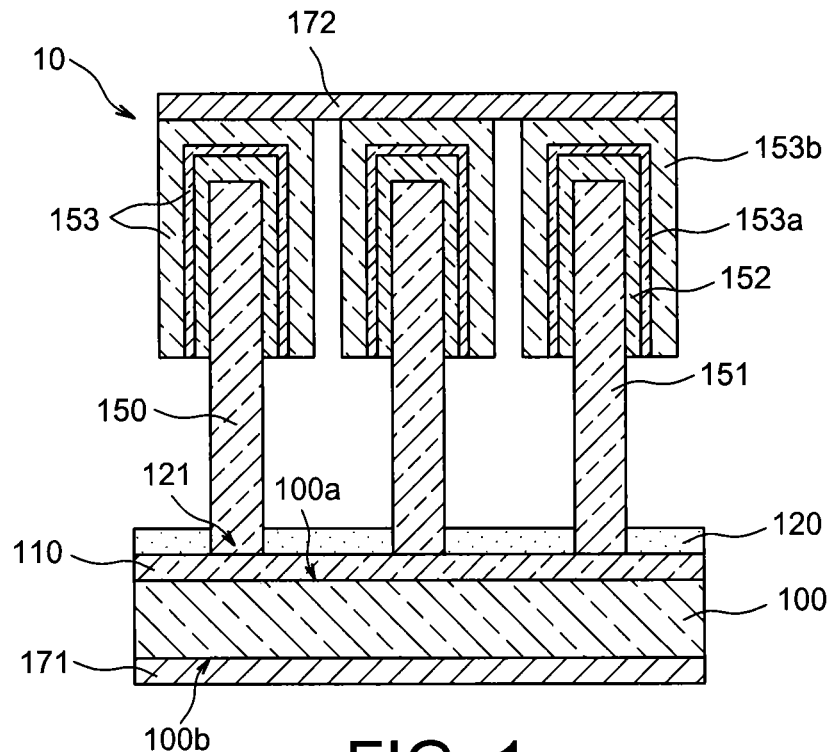
FIG. 1 shows a semiconducting structure according to a first embodiment of the invention.

FIG. 1 diagrammatically shows a semiconducting structure 10 according to a first embodiment of the invention that is adapted to emit electromagnetic radiation.

Such a semiconducting structure 10 comprises:
a first polarisation electrode 171;
a semiconducting substrate 100 comprising a first and a second face 100a, b, the second face being in contact with the first polarisation electrode 171;
a so-called buffer layer 110 in contact with the first face 100a of the substrate 100;
a masking layer 120 in contact with the buffer layer 110, the masking layer 120 having three openings 121;

three semiconducting micro- or nano-wires 150 each in contact with the buffer layer 110 through one of the openings 121, each of the micro- or nano-wires 150 comprising a part 151, called the contact part, in contact with the buffer layer 110, an active zone 152 in contact with the contact part 151 and a part 153 called the polarisation part in contact with the active zone 152;

a polarisation electrode 172 in contact with each of the micro- or nano-wires 150 at the polarisation part 153.

In the above and in the remainder of this document, the term semiconducting nano- or micro-wires refers to semiconducting structures with three dimensions, two of which are of the same order of magnitude between 5 nm and 2.5 µm, the third dimension being at least 10 times larger than the largest of the other two dimensions.

The substrate 100 is a semiconducting substrate such as a silicon substrate made of silicon carbide, sapphire or germanium. The substrate 100 is approximately plane.

The substrate 100 has a first type of conductivity. The substrate 100 has a high concentration of majority carriers to limit electrical losses related to the electrical resistance between the substrate 100 and the micro- or nano-wires 150.

Thus according to the embodiment shown in FIG. 1 in which the substrate 100 is a silicon substrate in which the type of conductivity is such that most carriers are electrons, the concentration of majority carriers can be chosen as being of the order of $10^{19}$ cm$^{-3}$.

The second face 100b of substrate 100 is in contact with the first metallic electrode 171.

The first electrode 171 is in the form of a conducting layer that extends on the second face 100b of the substrate 100. The first electrode 171 is composed of a conducting material adapted to the type of conductivity of the substrate 100 so as to create a ohmic contact between the substrate 100 and the first electrode 171. In the embodiment shown in FIG. 1 in which the substrate 100 is made of silicon for which majority carriers are electrons, the material forming the first electrode 100 may for example be nickel silicide NiSi, aluminium Al or titanium Ti.

The first face 100a of the substrate 100 is in contact with the buffer layer 110.

The buffer layer 110 is a semiconducting layer that extends on the first face 100a of the substrate 100. The buffer layer 110 is composed mainly of magnesium nitride in the form $Mg_xN_y$, in other words it is composed of at least 95% magnesium nitride. The buffer layer 110 is a crystalline layer and is preferably monocrystalline. The buffer layer 110 is between 1 and 100 nm and preferably between 1 and 10 nm thick.

According to one preferred embodiment of the invention, the buffer layer 110 is composed mainly of magnesium nitride in the form $Mg_3N_2$.

The buffer layer 110 has the first type of conductivity in order to limit the interface resistance between the buffer layer 110 and the substrate 100. In this first embodiment, the first type of conductivity is the type in which the majority carriers are electrons and there is an excess proportion of nitrogen, such that the concentration of majority carriers in the buffer layer is equal to at least $1 \times 10^{18}$ cm$^{-3}$.

The buffer layer has, for the face that is opposite to the substrate 100, a nitrogen (N) polarization.

This allows to obtain a nitride semiconducting micro- or nano-wires growth such as, for example, gallium nitride. The wires are vertical structures that comprise a vertical part along the m crystallographic plan. Thus vertical part could be the part in contact with the buffer layer 110. The masking layer 120 extends to the surface of the buffer layer 110 that is opposite the substrate 100. The masking layer 120 is made from a material on which the element(s) making up the micro- or nano-wires 150 are not deposited during an epitaxial deposit. The material forming the masking layer 120 for the micro- or nano-wires 150 may be gallium arsenide (GaAs), silicon nitride (SiN), titanium (Ti), titanium nitride (TiN) or silicon dioxide ($SiO_2$). The thickness of the masking layer 120 may be between 1 and 50 nm.

The masking layer 120 comprises three through openings 121, each of these openings 121 opening up on the surface of the buffer layer 110. The openings 121 are approximately circular in shape, and the diameter is chosen as a function of the diameter of the micro- or nano-wires 150.

Each of the openings 121 contains one micro- or nano-wire 150.

Each of the micro- or nano-wires 150 is a semiconducting structure elongated in the direction approximately perpendicular to the surface of the buffer layer 110. Each micro- or nano-wire 150 is generally elongated and cylindrical in shape. The diameter of each of the micro- or nano-wires 150 is chosen as a function of the application of the semiconducting structure 10 containing them. For example, in the embodiment shown in FIG. 1, the diameter of each micro- or nano-wire 150 is between entre 100 nm and 5 µm.

The height of each micro- or nano-wire 150 is greater than at least 10 times the diameter of the micro- or nano-wire 150 and is between 1 and 50 µm.

Each micro- or nano-wire 150 comprises a contact part 151 in contact with the surface of the buffer layer 110.

As can be seen in FIG. 1, each contact part 151 represents the major part of the corresponding micro- or nano-wire 150. Each contact part 151 is composed mainly of a direct band gap semiconducting nitride with the first type of conductivity. The semiconducting nitride in which the contact parts 151 are made is adapted as a function of the application of the semiconducting structure 10 comprising the micro- or nano-wires 150.

Thus, in the embodiment shown in FIG. 1, each contact part 151 is made from gallium nitride (GaN) and its concentration of majority carriers is between $1 \times 10^{18}$ and $5 \times 10^{18}$ cm$^{-3}$. Depending on the target applications, the material from which each of the contact parts 151 is made may be selected from the group comprising gallium nitride (GaN), aluminium nitride (AlN), indium nitride (InN) and indium-gallium nitrides of type $In_xGa_{1-x}N$ where x is between 0 and 1, and the aluminium-gallium-indium nitrides type $Al_xIn_yGa_{1-x-y}N$, where x+y is between 0 and 1.

Each active zone 152 is in contact with the contact part 151 of the corresponding micro- or nano-wire 150. Each active zone 152 is a layer covering contact part 151 over part of the periphery and on the end of the corresponding contact part 151, said end of the contact part 151 being the end opposite the buffer layer 110. Such a configuration of the active zones 152 in which they are in simultaneous contact with one end and with the periphery of the corresponding contact part 151 is called the shell type.

The active zones 152 are at least partially made from a direct band gap semiconducting nitride with a second type of conductivity opposite to the first type of conductivity.

Thus, each active zone 152 forms a semiconducting junction with the corresponding contact part 151. The active zone 152 may comprise confinement means such as multiple quantum wells to increase the emission efficiency of each of the micro- or nano-wires.

In the embodiment shown in FIG. 1, the active zone 152 is made from gallium and indium nitride in the form $In_xGa_{1-x}N$. According to this embodiment, the multiple quantum wells are obtained by alternating two different relative compositions of indium In and gallium Ga, over the thickness of the active zone 152. In this embodiment, the concentration of majority carriers in each active zone 152 is between $1\times10^{16}$ and $1\times10^{18}$ cm$^{-3}$ and it may be varied across the thickness.

The active zones 152 are well known as such to those skilled in the art and consequently will not be described in further detail in this document.

Each active zone 152 is in contact around its outer periphery with the polarisation part 153 of the corresponding micro- or nano-wire.

The polarisation parts 153 enable contact of the corresponding micro- or nano-wire 150 and also act as an electron blocking layer in the case in which the structure 10 is a structure adapted for the emission of electromagnetic radiation.

Such an electron blocking layer function makes it possible to locate electron-hole recombinations in the active zone 152 in order to increase the emission efficiency of each of the micro- or nano-wires 150.

The polarisation parts 153 are preferably composed mainly of direct band gap semiconducting nitride. Each of the polarisation parts 153 has a second type of conductivity. The concentration of majority carriers in each polarisation part 153 is between $1\times10^{17}$ and $1\times10^{18}$ cm$^{-3}$.

In the embodiment shown in FIG. 1, the polarisation parts 153, also acting as an electron blocking layer, comprise a first zone 153a made from gallium and aluminium nitride (AlGaN), in contact with the active zone 152.

According to this embodiment, each polarisation part 153 also comprises a second zone 153b made from gallium nitride (GaN) in contact with the first zone 153a of the polarisation part 153, to give good electrical contact between the second electrode 172 and the active zone.

Each polarisation part 153 is in contact through its second zone 153b with the second electrode 172, to enable polarisation of each of the micro- or nano-wires 150.

The second electrode 172 is adapted to enable polarisation of each of the micro- or nano-wires 150 at their polarisation part 153 and also to allow electromagnetic radiation emitted or received by the micro- or nano-wires 153 to pass through.

These two functions may be obtained using a second electrode formed from two different stages, not shown, a first stage formed from a thin at least partially transparent conducting layer to contact all polarisation parts of the micro- or nano-wires and a second distribution stage that only covers a small part of the surface of the conducting layer, for example being in the shape of a comb. The thickness of the second distribution stage is greater than the thickness of the conducting layer forming the first stage in order to reduce the series resistance.

According to this configuration, the first stage may be formed from a nickel-gold (Ni—Au) or an indium-tin oxide (ITO) layer. The second stage in this configuration may be formed from a nickel-gold comb.

Together, the second electrode and the first electrode form means of connecting the micro- or nano-wires 150 adapted to polarise each micro- or nano-wire 150 and their active zone 153.

Such a semiconducting structure 10 can be obtained using a manufacturing method like that shown in FIGS. 2A to 2F.

Figure 2A:
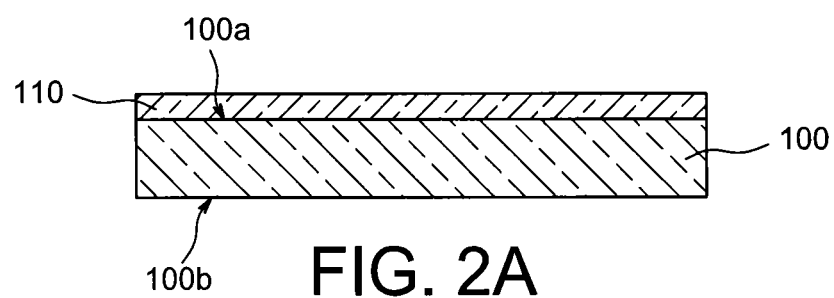
FIGS. 2A to 2F show the various steps in manufacturing the semiconducting structure shown in FIG. 1.
Figure 2B:
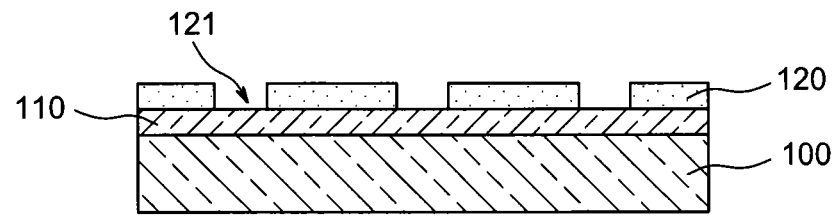
Figure 2C:
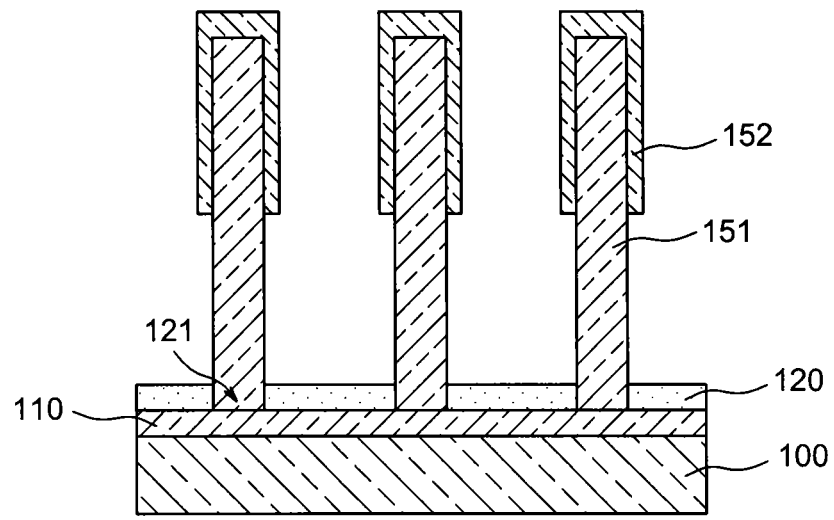
Figure 2D:
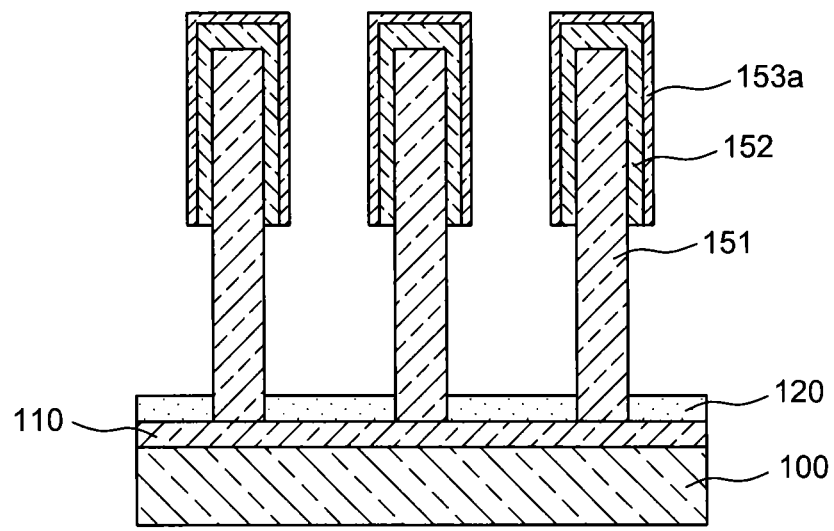
Figure 2E:
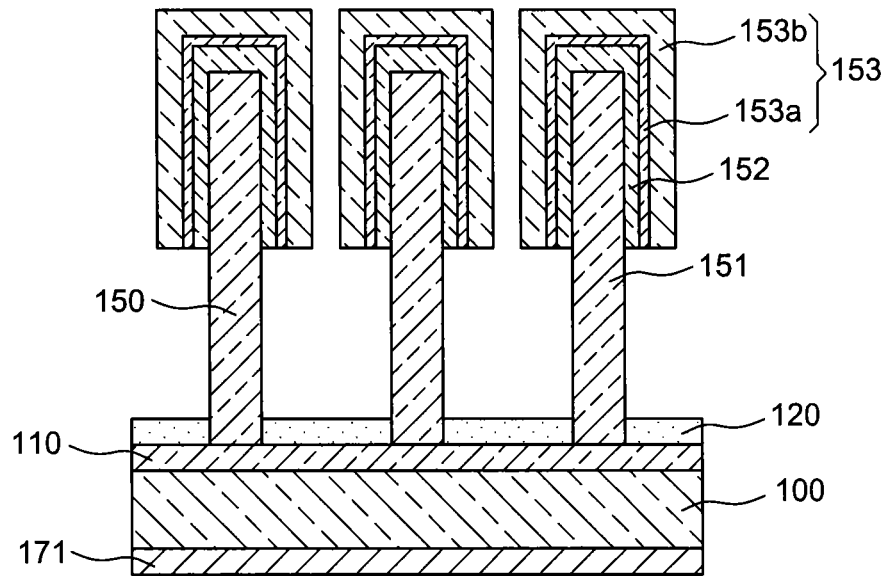
Figure 2F:
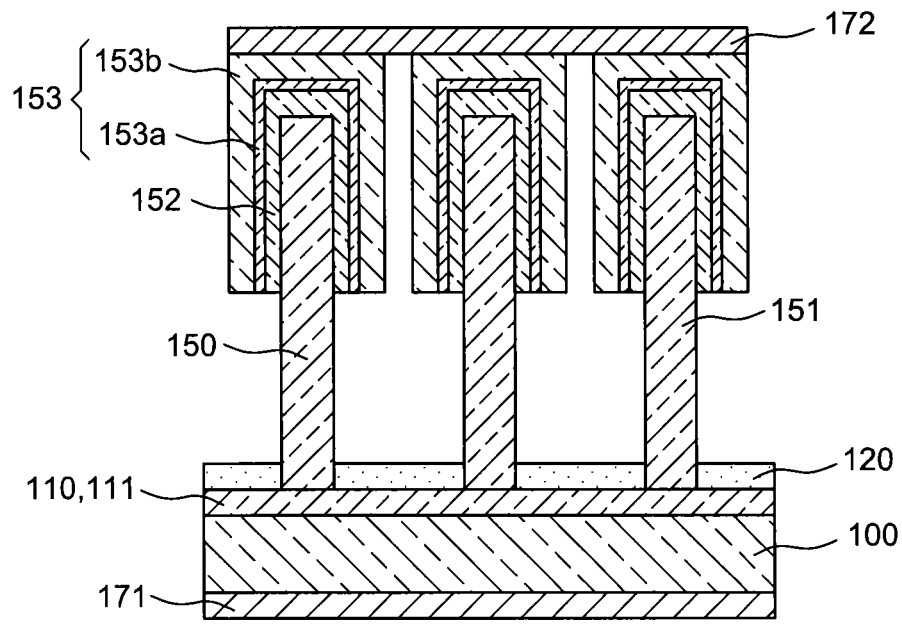

A method of manufacturing a semiconducting structure 10 according to the first embodiment comprises the following steps:
  provide the semiconducting substrate 100;
  form the first electrode 171, not shown in FIGS. 2A to 2F, on the second face of the substrate 100;
  form the buffer layer 110 as shown in FIG. 2A, the buffer layer 110 being composed mainly of magnesium nitride in its form Mg$_x$N$_y$, said layer being crystalline;
  deposit the masking layer 120;
  as shown in FIG. 2B, form the openings 121 passing through the masking layer 120, this formation of openings 121 possibly being obtained by the combination of a lithography sub-step and an etching sub-step;
  as shown in FIGS. 2C to 2E, form the micro- or nano-wires 150 in the openings 121;
  as shown in FIG. 2F, form the second electrode 172 in contact with each of the polarisation parts 153 of the micro- or nano-wires 150.

The step to form the buffer layer 110 is made using at least one epitaxial deposition sub-step according to a deposition method, such as organometallic vapour phase epitaxy, molecular beam epitaxy, hybrid vapour phase epitaxy or reactive cathodic sputtering.

The deposition method for the buffer layer 110 is selected as a function of the stoichiometry required for the buffer layer 110. Thus, for an Mg$_3$N$_2$ type stoichiometry, the deposition method may be selected from among deposition methods such as organometallic vapour phase epitaxy, molecular beam epitaxy and hybrid vapour phase epitaxy. For an Mg$_x$N$_y$ type stoichiometry, deposition methods use a solid magnesium target, such as reactive cathodic sputtering and reactive laser ablation.

The formation step of the micro- or nano-wires 150 may be done by epitaxy deposition sub-steps so as to successively form the contact part 151, the active zone 152 and the polarisation part 153 for each of the micro- or nano-wires.

These epitaxy deposition sub-steps may make use of deposition methods such as organometallic vapour phase epitaxy, molecular beam epitaxy and hybrid vapour phase epitaxy. Since these sub-steps are known to those skilled in the art, they will not be described in further detail in this document.

FIGS. 3A to 3F show a method for the formation of a semiconducting structure 10 according to a second embodiment of the invention. Such a structure is different from a structure according to the first embodiment of the invention in that the buffer layer 110 comprises a second zone 112 composed mainly of semiconducting nitride, said second zone 112 including the surface of the buffer layer 110 that is opposite the first face 100a of the substrate 100.

The buffer layer 110 according to this second embodiment comprises a first zone 111 in contact with the first face 100a of the substrate 100, and then a second zone 112 including the surface of the buffer layer 110, across its thickness.

The first zone 111 of the buffer layer 110 has the same characteristics as a buffer layer 110 according to the first embodiment.

The second zone 112 of the buffer layer 110 is composed mainly of a semiconducting nitride with the first type of conductivity. This second zone of the buffer layer 110 preferably has approximately the same composition as the contact part 151 of the micro- or nano-wires 150, in order to optimise growth of the micro- and nano-wires 150 during the formation step of these micro- or nano-wires 150. The thickness of the second zone 112 of the buffer layer 110 is between 1 nm and 1 μm, and is preferably of the order of 100 nm.

Figure 3A:
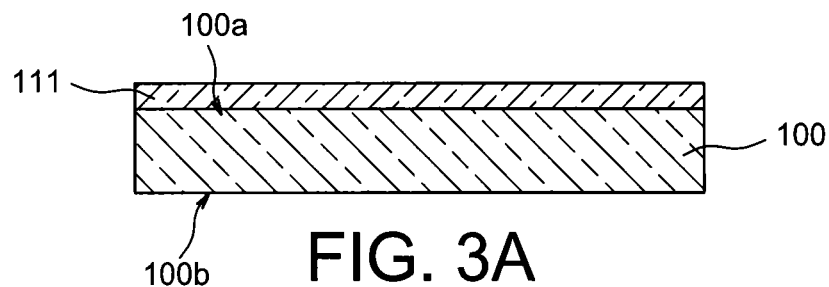
FIGS. 3A to 3F show the various steps in manufacturing a second embodiment of the semiconducting structure.
Figure 3B:
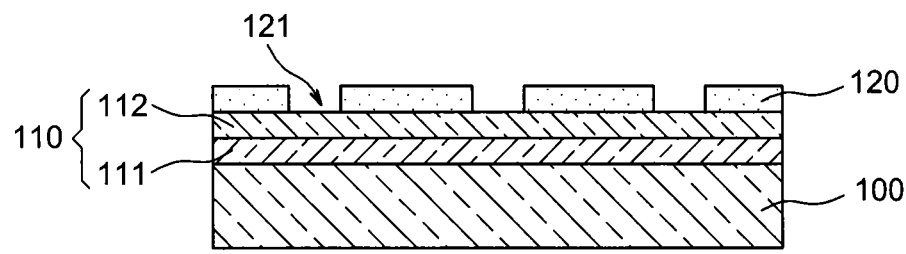
Figure 3C:
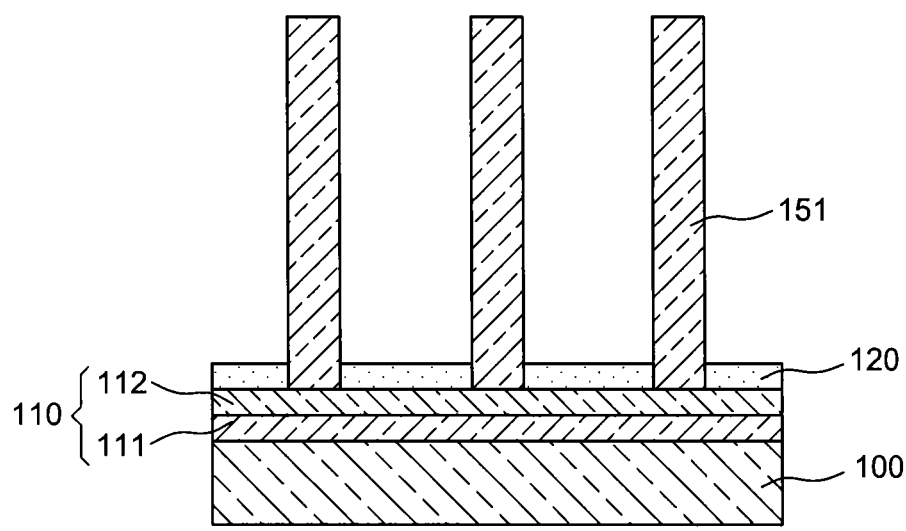
Figure 3D:
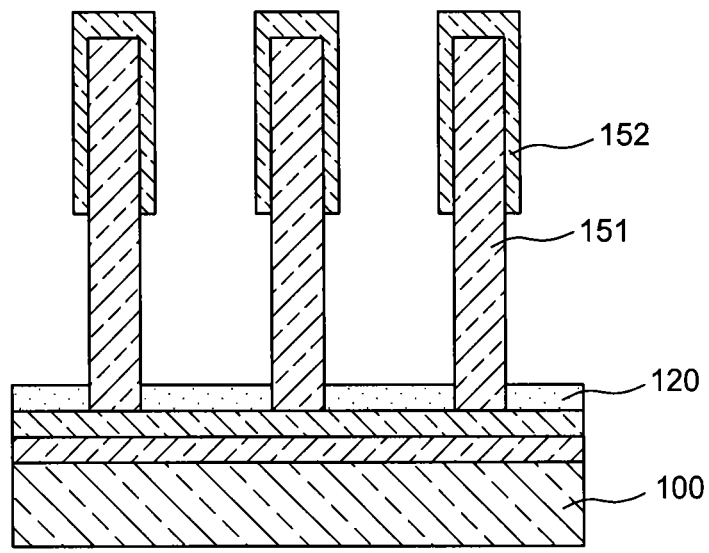
Figure 3E:
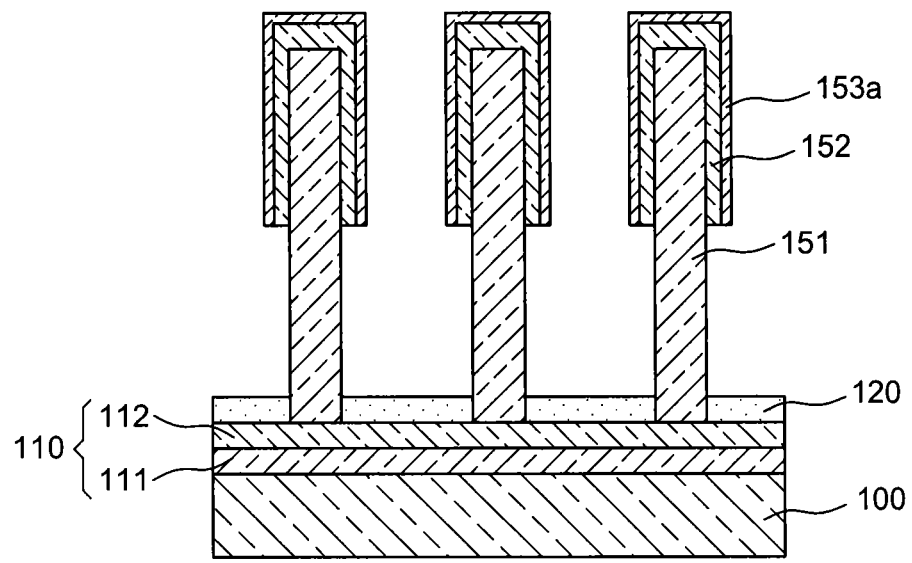
Figure 3F:
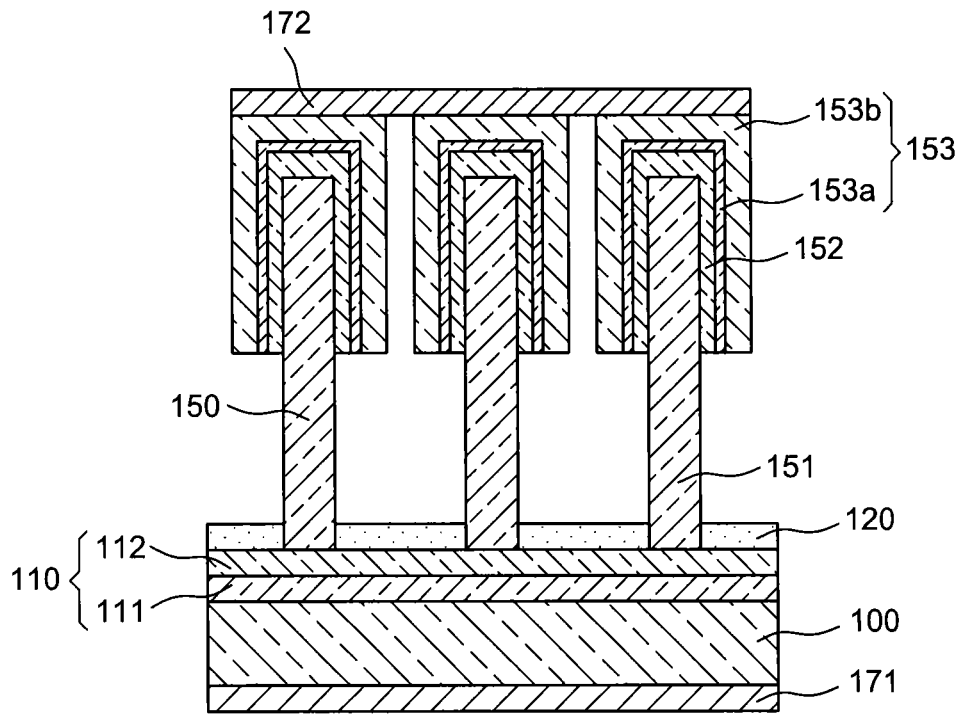

The method of manufacturing a semiconducting structure 10 according to this second embodiment is different from the method of manufacturing a semiconducting structure according to the first embodiment in that the formation step of the buffer layer 110, as shown in FIGS. 3A and 3B, comprises a change in the material deposited during deposition of the buffer layer 110, to form the first and second zones 111, 112 successively. As shown in FIGS. 3C to 3F, the remaining steps in the manufacturing method are identical to the steps in the method of manufacturing a structure according to the first embodiment.

Figure 4:
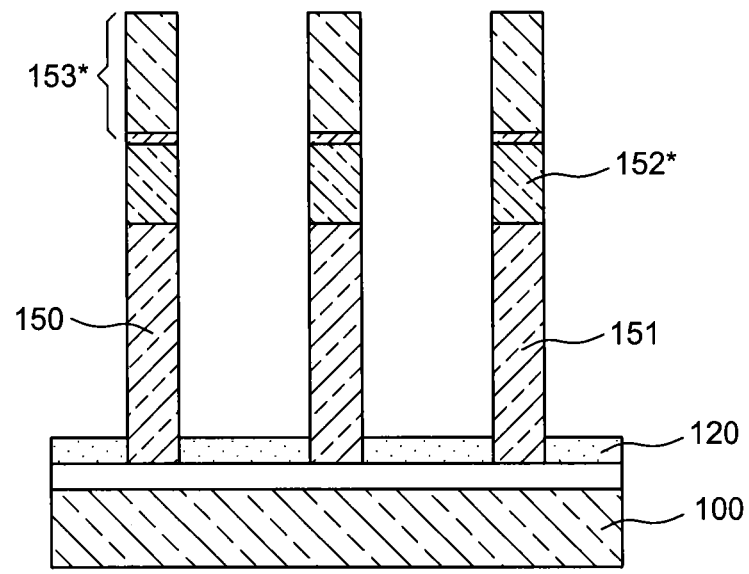
FIG. 4 shows micro-wires according to one possibility of the invention.

FIG. 4 illustrates one possibility of the invention in which the active zones 152* of the micro or nano-wires are axial type active zones 152* instead of shell-type active zones. Such active zones 152* are different from active zones according to the two embodiments described above in that they lie along the extension of the corresponding contact parts and in that the contact between said active zones 152* and the corresponding contact parts 151 is only at the end of the contact part 151.

According to this possibility, each polarisation part 153* also lies along the extension of the corresponding contact part 151 and active zone 152*, contact between each polarisation part 153* and the corresponding active zone 152* only being made at the end of the active zone 152*.

The only difference between the method of manufacturing a semiconducting structure 10 according to this possibility and the method of manufacturing a semiconducting structure 10 according to the first embodiment is in the formation step of the micro- or nano-wires 150 that is adapted for the formation of micro- or nano-wires including an axial type active zone.

In the various embodiments or possibilities described above, the micro- or nano-wires 150 are micro- or nano-wires obtained by selective growth by means of a masking layer 120 with openings 121. However, the micro- or nano-wires 150 could be formed by local growth by catalyst or self-organised growth, without going outside the scope of the invention.

Although the various embodiments or possibilities described above are applicable for semiconducting structures 10 adapted to emit electromagnetic radiation, those skilled in the art could easily adapt such semiconducting structures 10 to receive electromagnetic radiation and to convert it into an electrical signal. Such an adaptation is made by adapting the active zone 152 of each micro- and nano-wire 150 and applying an appropriate polarisation on the semiconducting structure. Such an adaptation of the semiconducting structure 10 may be made to form either a semiconducting structure 10 dedicated to measurement or detection of an electromagnetic radiation or a semiconducting structure 10 dedicated to photovoltaic applications. Such adaptations may be made without going outside the scope of the invention.

Although the majority carriers of the first type of conductivity in the different embodiments and possibilities described above are electrons, it is possible for the majority carriers of the first conductivity type to be holes without going outside the scope of the invention, and in this case the majority carriers of the second type of conductivity would be electrons.

The invention claimed is:

1. A manufacturing method of at least one semiconducting micro- or nano-wire used for formation of an optoelectric structure, the manufacturing method comprising:
providing a semiconducting substrate including a first face and a second face;
forming a crystalline layer as a buffer layer, on the first face of the substrate, the buffer layer including a first zone in contact with the first face over at least part of a thickness of the buffer layer, the first zone being composed mainly of magnesium nitride in a form $Mg_xN_y$, where x and y are positive numbers different from zero; and
forming at least one semiconducting micro- or nano-wire on the buffer layer, at least one part of the micro- or nano-wire, as a contact part, composed mainly of a direct band gap semiconducting nitride, the contact part being a part of the micro- or nano-wire in contact with the buffer layer.

2. The manufacturing method according to claim 1, wherein the contact part of the at least one semiconducting micro or nano-wire is constituted of gallium nitride.

3. The manufacturing method according to claim 1, wherein the formed buffer layer is composed mainly of magnesium nitride in the form of $Mg_xN_y$.

4. The manufacturing method according to claim 1, wherein the formed buffer layer includes at least one second zone over the thickness of the buffer layer including a surface of the second zone that is opposite the first face of the substrate, the second zone being composed mainly of a direct band gap semiconducting nitride other than a magnesium nitride or with a composition substantially same as the contact part of the at least one semiconducting micro- or nano-wire.

5. The manufacturing method according to claim 1, wherein the formed buffer layer has a thickness of between 1 nm and 100 nm.

6. The manufacturing method according to claim 1, wherein in the formed buffer layer, the first zone is composed mainly of magnesium nitride in a form $Mg_3N_2$.

7. The manufacturing method according to claim 1, wherein the formed buffer layer has a conductivity for which majority carriers are electrons, the direct band gap semiconducting nitride forming at least the contact part with a same type of conductivity as the buffer layer.

8. The manufacturing method according to claim 1, wherein during the forming of the at least one semiconducting micro- or nano-wire, the direct band gap semiconducting nitride forming at least the contact part being chosen from the group of gallium nitride (GaN), aluminium nitride (AlN), indium nitride (InN), indium-gallium nitrides of type $In_xGa_{1-x}N$, where x is between 0 and 1, and aluminium-gallium-indium nitrides type of $Al_xIn_yGa_{1-x-y}N$, where x+y is between 0 and 1.

9. The manufacturing method according to claim 1, wherein the forming at least one semiconducting micro- or nano-wire further comprises:
depositing a masking layer on the buffer layer, a material forming the masking layer being configured to enable selective growth of the direct band gap semiconducting nitride on the buffer layer without any deposition of the direct band gap semiconducting nitride on the masking layer, the depositing being an adapted epitaxial deposition of the direct band gap semiconducting nitride;
forming at least one opening in the masking layer leading to the buffer layer, and
forming the at least one semiconducting micro or nano-wire in the at least one opening by selective epitaxial deposition.

10. The manufacturing method according to claim 1, wherein the first zone of the formed buffer layer is composed mainly of monocrystalline magnesium nitride.

11. The manufacturing method according to claim 1, wherein the formed buffer layer has a thickness of between 2 nm and 10 nm.

12. A manufacturing method of at least one semiconducting micro- or nano-wire used for formation of an optoelectric structure, the manufacturing method comprising:
providing a semiconducting substrate including a first face and a second face;
forming a crystalline layer as a buffer layer, on the first face of the substrate, the buffer layer including a first zone in contact with the first face over at least part of a thickness of the buffer layer, the first zone is made of magnesium nitride in a form $Mg_xN_y$, where x and y are positive numbers different from zero; and forming at least one semiconducting micro- or nano-wire on the buffer layer, at least one part of the micro- or nano-wire, as a contact part, composed mainly of a direct band gap semiconducting nitride, the contact part being a part of the micro- or nano-wire in contact with the buffer layer.

* * * * *